United States Patent
Ikeda et al.

(10) Patent No.: US 10,991,541 B2
(45) Date of Patent: Apr. 27, 2021

(54) DETECTOR FOR DETECTING INCIDENT ELECTRON BEAM

(71) Applicant: CANON KABUSHIKI KAISHA, Tokyo (JP)

(72) Inventors: Hajime Ikeda, Yokohama (JP); Masahiro Kobayashi, Tokyo (JP); Yukihiro Kuroda, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/716,668

(22) Filed: Dec. 17, 2019

(65) Prior Publication Data
US 2020/0194216 A1    Jun. 18, 2020

(30) Foreign Application Priority Data
Dec. 18, 2018 (JP) .............................. JP2018-236141

(51) Int. Cl.
*H01J 37/244* (2006.01)
*G01T 1/24* (2006.01)
*H01J 37/05* (2006.01)

(52) U.S. Cl.
CPC ............. *H01J 37/05* (2013.01); *G01T 1/24* (2013.01); *H01J 37/244* (2013.01); *H01J 2237/2441* (2013.01)

(58) Field of Classification Search
CPC .. H01J 37/05; H01J 37/244; H01J 2237/2441; G01T 1/24; G01T 1/244
See application file for complete search history.

(56) References Cited

U.S. PATENT DOCUMENTS

| | | | |
|---|---|---|---|
| 5,491,339 A * | 2/1996 | Mitsui | H01J 37/244 250/310 |
| 5,548,121 A * | 8/1996 | Balmer | H01J 37/244 250/370.01 |
| 7,709,869 B2 | 5/2010 | Kuroda | |
| 7,911,521 B2 | 3/2011 | Kuroda et al. | |
| 7,928,477 B2 | 4/2011 | Kobayashi et al. | |
| 7,935,995 B2 | 5/2011 | Watanabe et al. | |
| 8,129,679 B2 * | 3/2012 | Mooney | H01J 37/05 250/305 |
| 8,456,559 B2 | 6/2013 | Yamashita et al. | |
| 8,552,353 B2 | 10/2013 | Kobayashi et al. | |

(Continued)

FOREIGN PATENT DOCUMENTS

JP         5540088 B2     7/2014
JP       2015-062012 A    4/2015

OTHER PUBLICATIONS

U.S. Appl. No. 16/711,991, filed Dec. 12, 2019 (First Named Inventor: Hajime Ikeda).

(Continued)

*Primary Examiner* — David E Smith
(74) *Attorney, Agent, or Firm* — Venable LLP

(57) ABSTRACT

A detector, comprising: a semiconductor substrate which detects an incident electron beam; a supporting substrate which is thicker than the semiconductor substrate and which supports the semiconductor substrate; and an insulating film layer which is provided between the semiconductor substrate and the supporting substrate, wherein at least one charge suppression film which is not electrically connected to the semiconductor substrate is formed inside the insulating film layer.

11 Claims, 6 Drawing Sheets

(56) References Cited

U.S. PATENT DOCUMENTS

| | | |
|---|---|---|
| 8,710,558 B2 | 4/2014 | Inoue et al. |
| 8,884,391 B2 | 11/2014 | Fudaba et al. |
| 9,147,708 B2 | 9/2015 | Okita et al. |
| 9,153,610 B2 | 10/2015 | Kobayashi et al. |
| 9,236,406 B2 | 1/2016 | Kuroda |
| 9,276,027 B2 | 3/2016 | Okita et al. |
| 9,305,954 B2 | 4/2016 | Kato et al. |
| 9,344,653 B2 | 5/2016 | Shimotsusa et al. |
| 9,445,026 B2 | 9/2016 | Kobayashi et al. |
| 9,538,112 B2 | 1/2017 | Wada et al. |
| 9,548,328 B2 | 1/2017 | Hasegawa et al. |
| 9,716,849 B2 | 7/2017 | Kobayashi et al. |
| 9,768,213 B2 | 9/2017 | Soda et al. |
| 9,818,794 B2 | 11/2017 | Okita et al. |
| 9,894,295 B2 | 2/2018 | Kawabata et al. |
| 10,009,560 B2 | 6/2018 | Kobayashi et al. |
| 10,021,321 B2 | 7/2018 | Kawabata et al. |
| 10,424,613 B2 | 9/2019 | Tsuboi et al. |
| 10,453,879 B2 | 10/2019 | Ikeda et al. |
| 10,483,307 B2 | 11/2019 | Sekine et al. |
| 10,498,979 B2 | 12/2019 | Kobayashi et al. |
| 10,535,688 B2 | 1/2020 | Onuki et al. |
| 2003/0132385 A1 | 7/2003 | Agano |
| 2006/0255270 A1* | 11/2006 | Kitamura ............... H01J 37/222 250/310 |
| 2013/0099129 A1 | 4/2013 | Sato |
| 2014/0061465 A1* | 3/2014 | Abe ..................... H01J 37/244 250/310 |
| 2017/0212221 A1 | 7/2017 | Goden et al. |
| 2018/0213167 A1 | 7/2018 | Miki et al. |
| 2018/0309946 A1 | 10/2018 | Ohya et al. |
| 2018/0374886 A1 | 12/2018 | Iwata et al. |
| 2019/0037161 A1 | 1/2019 | Ikeda et al. |
| 2019/0222733 A1 | 7/2019 | Nishide et al. |
| 2019/0305146 A1 | 10/2019 | Kuroda |
| 2020/0099880 A1 | 3/2020 | Kobayashi |

OTHER PUBLICATIONS

U.S. Appl. No. 16/780,666, filed Feb. 3, 2020 (First Named Inventor: Fumihiro Inui).

* cited by examiner

DETECTOR FOR DETECTING INCIDENT ELECTRON BEAM

BACKGROUND OF THE INVENTION

Field of the Invention

The present invention relates to a detector for detecting an incident electron beam.

Description of the Related Art

Among detectors (detector elements) which measure an amount of incident electron beams, there are detectors which directly detect an electron beam without involving a scintillator. In this case, a semiconductor substrate for detecting an electron beam which is included in a detector is desirably a thin film in order to reduce crosstalk.

In this regard, Japanese Patent No. 5540088 discloses the use of a supporting substrate for supporting (holding) a semiconductor substrate that is a thin film portion in order to maintain mechanical strength of a detector even when the semiconductor substrate is a thin film.

SUMMARY OF THE INVENTION

However, when an electron beam is incident to the detector disclosed in Japanese Patent No. 5540088, a large number of secondary electrons are generated in the supporting substrate. Therefore, while the supporting substrate and the semiconductor substrate must be insulated from each other, an insulating film that performs this role is charged by electron beams and secondary electrons. In addition, when a potential difference exceeds a breakdown voltage and causes a breakdown, the detector (the detector element) may fail due to an instantaneous flow of a large current.

In consideration thereof, an object of the present invention is to prevent a detector from failing in a structure that maintains mechanical strength with a supporting substrate.

A first aspect of the technology of the present disclosure is:

a detector, comprising:

a semiconductor substrate which detects an incident electron beam;

a supporting substrate which is thicker than the semiconductor substrate and which supports the semiconductor substrate; and an insulating film layer which is provided between the semiconductor substrate and the supporting substrate, wherein at least one charge suppression film which is not electrically connected to the semiconductor substrate is formed inside the insulating film layer.

According to the present invention, a detector can be prevented from failing in a structure that maintains mechanical strength with a supporting substrate.

Further features of the present invention will become apparent from the following description of exemplary embodiments with reference to the attached drawings.

DESCRIPTION OF THE EMBODIMENTS

Although embodiments of the present invention will be described hereinafter with reference to the accompanying drawings, it is to be understood that the present invention is not limited to the following embodiments.

First Embodiment

In the first embodiment, with respect to an insulator (an insulating film layer) arranged between a semiconductor substrate and a supporting substrate in a detector, a charge suppression film (a charge prevention film) that suppresses charge of an insulating film inside the insulator is formed. Accordingly, in a structure that maintains mechanical strength with a supporting substrate, an insulating film can be prevented from being charged and a detector can be prevented from failing.

Configuration of Solid-State Element

Figure 1:
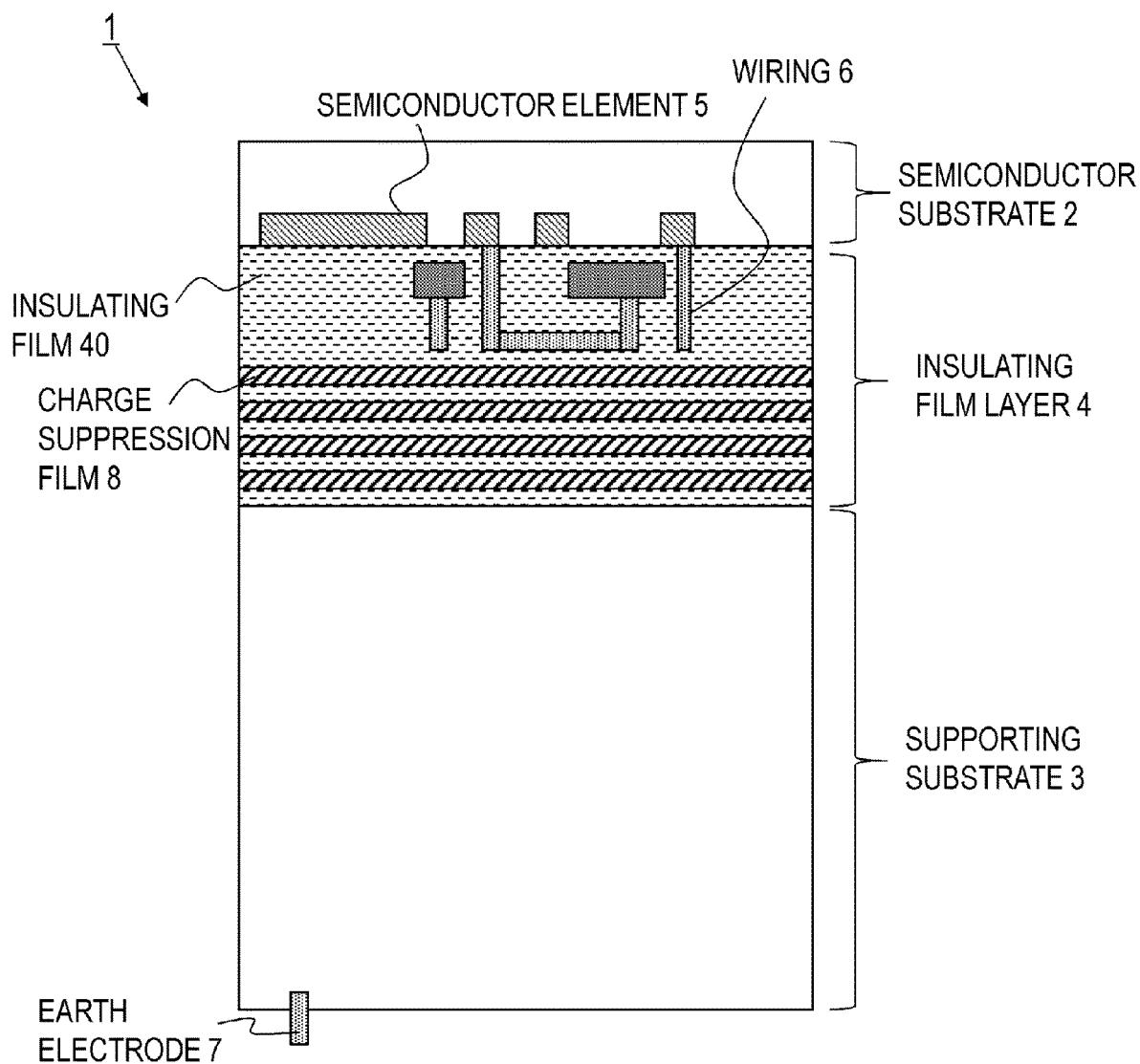
FIG. 1 is a configuration diagram of an example of a solid-state element according to a first embodiment.

FIG. 1 shows a configuration diagram of a solid-state element 1 which is an example of the detector (the detector element) according to the present embodiment. The solid-state element 1 is an apparatus which measures an amount of incident electron beams and includes a semiconductor substrate 2 and a supporting substrate 3. The supporting substrate 3 and the semiconductor substrate 2 are mechanically bonded (connected) to each other while being electrically insulated from each other via an insulating film layer 4. Due to the supporting substrate 3 being bonded to the semiconductor substrate 2 via the insulating film layer 4 in this manner, the mechanical strength of the solid-state element 1 is maintained even when the semiconductor substrate 2 is a thin film.

The present embodiment will be described on the assumption that an electron beam is incident to the semiconductor substrate 2 from a side (hereinafter, referred to as an upper part) where the semiconductor substrate 2 is formed relative to the supporting substrate 3. Therefore, in the solid-state element 1, the semiconductor substrate 2, the insulating film layer 4, and the supporting substrate 3 are stacked in this order from the upper part.

The semiconductor substrate 2 detects an electron beam incident from the upper part. The semiconductor substrate 2 is a semiconductor layer mainly constituted by a semiconductor such as silicon and includes a semiconductor element 5. The semiconductor element 5 is a part of a mechanism (a conversion mechanism) which converts an electron generated by the incidence of an electron beam into an output signal. In a similar manner to known CMOS sensors, the conversion mechanism can use method such as transferring electrons accumulated in a photodiode to a floating diffusion layer via a transfer transistor and reading a potential via a source follower. Alternatively, a reading method may be used which adopts a potential of an accumulation unit without modification as a gate potential of a source follower without using a transfer transistor. Alternatively, an element such as a single-photon avalanche diode (SPAD) may be used without using a transfer transistor.

The supporting substrate 3 has conductivity and is fixed to a constant potential via an earth electrode 7 (a grounding electrode) which is electrically connected to the supporting substrate 3. In addition, by making the supporting substrate 3 thicker than the semiconductor substrate 2 and having the supporting substrate 3 support the semiconductor substrate 2, mechanical strength of the solid-state element 1 is sufficiently maintained.

The insulating film layer 4 is an insulating film layer mainly constituted by an insulating film 40 and is formed (provided) between the semiconductor substrate 2 and the supporting substrate 3. The insulating film layer 4 internally includes wiring 6 and a charge suppression film 8. The wiring 6 is a wiring layer electrically connected to the semiconductor substrate 2.

The charge suppression film 8 is a conductor capable of taking forms such as a film shape, a grid shape, and a linear shape. In this case, various known materials can be used as a material of the charge suppression film 8 as long as the material is a conductor, and the charge suppression film 8 is constituted by conductor wiring, a conductor film, a stack thereof, or a mixture thereof. In addition, the charge suppression film 8 is preferably a plurality of layers that sandwich the insulating film 40. In other words, the plurality of charge suppression films 8 are favorably configured to be stacked via the insulating film 40. This is in order to realize a configuration of the insulating film layer 4 that is less likely to be charged while ensuring insulation properties thereof.

Furthermore, a large current flows to the charge suppression film 8 and the charge suppression film 8 is fixed to a constant potential. Therefore, preferably, the charge suppression film 8 is not electrically connected to the wiring 6 and the semiconductor substrate 2 in the solid-state element 1 (chip) but the charge suppression film 8 is electrically connected to an electrode (a power supply) outside of the solid-state element 1 (chip).

Effect

When an electron beam is incident from the upper part of the solid-state element 1 described above, an electron having penetrated to the supporting substrate 3 causes ionization inside the supporting substrate 3 and, consequently, a large number of high-energy electrons are generated. A part of the electrons penetrates deep into the insulating film layer 4 with high kinetic energy and remains as a fixed charge. At this point, a high potential difference is instantaneously created between the insulating film layer 4 and the wiring 6. However, by including the charge suppression film 8 inside the insulating film layer 4, since electrified charges are gradually discharged by the charge suppression film 8, charge of the insulating film 40 in the insulating film layer 4 can be suppressed. Therefore, the solid-state element 1 can be prevented from failing.

Second Embodiment

In the solid-state element 1 according to the present embodiment, in addition to the structure of the solid-state element 1 according to the first embodiment, a reverse surface element 9 which is a semiconductor element is formed on a surface (a rear surface) that is not in contact with the insulating film layer 4 in the supporting substrate 3.

Figure 2:
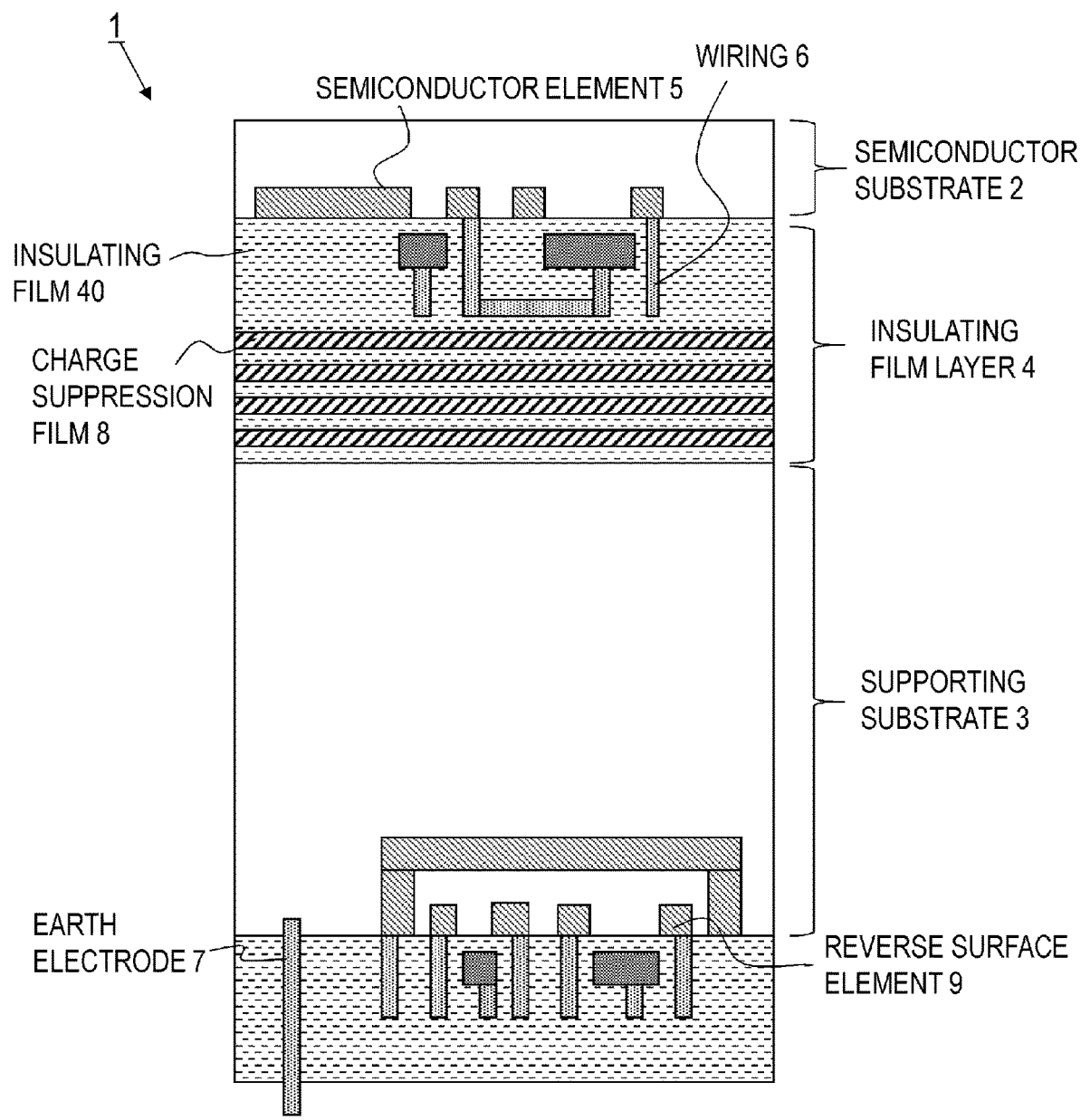
FIG. 2 is a configuration diagram of an example of a solid-state element according to a second embodiment.

FIG. 2 shows a configuration diagram of the solid-state element 1 according to the present embodiment. In the present embodiment, the supporting substrate 3 is constituted by silicon (a semiconductor). In other words, in the present embodiment, the supporting substrate 3 can be described as a semiconductor layer.

In this case, the reverse surface element 9 constitutes a circuit (a peripheral circuit) such as a column drive circuit, an AD conversion circuit, or a timing generator with respect to a pixel (a sensor) constituted by the semiconductor element 5. Therefore, when an incident electron reaches the reverse surface element 9, the reverse surface element 9 malfunctions. In consideration thereof, the thickness of the supporting substrate 3 must exceed a penetration depth of incident electron beams. A penetration depth in the present embodiment refers to a depth at which incident electron beam energy decreases to energy that is 1/e (e denotes natural logarithm) times the incident electron beam energy. It should be noted that the penetration depth is not limited to the depth at which incident electron beam energy decreases to energy that is 1/e (e denotes natural logarithm) times the incident electron beam energy and may be, for example, a depth at which incident electron beam energy decreases to energy that is ½ times the incident electron beam energy. In addition, from the above, it is shown that the greater the penetration depth of an electron beam with respect to a given material (atom), the lower a ratio (an absorption coefficient) of electron beam energy absorbed by the material per unit thickness (length). The penetration depth takes different values depending on a magnitude of electron beam energy of an incident electron beam, and an atomic number, an atomic weight, and density of constituent atoms (materials) of the incident electron beam.

For example, in a case of incidence of an electron beam at 300 keV that is typical electron beam energy of a transmission electron microscope, the penetration depth of the electron beam into silicon is around 425 μm. Therefore, in order to prevent an electron beam from directly penetrating into the reverse surface element 9, the thickness of the supporting substrate 3 may be set to, for example, 725 μm.

In addition, since ionization due to an electron beam occurs inside the supporting substrate 3, generated electrons may possibly interfere with operations of the reverse surface element 9. Therefore, the reverse surface element 9 is preferably separated from the supporting substrate 3 by a well structure.

Figure 3A:
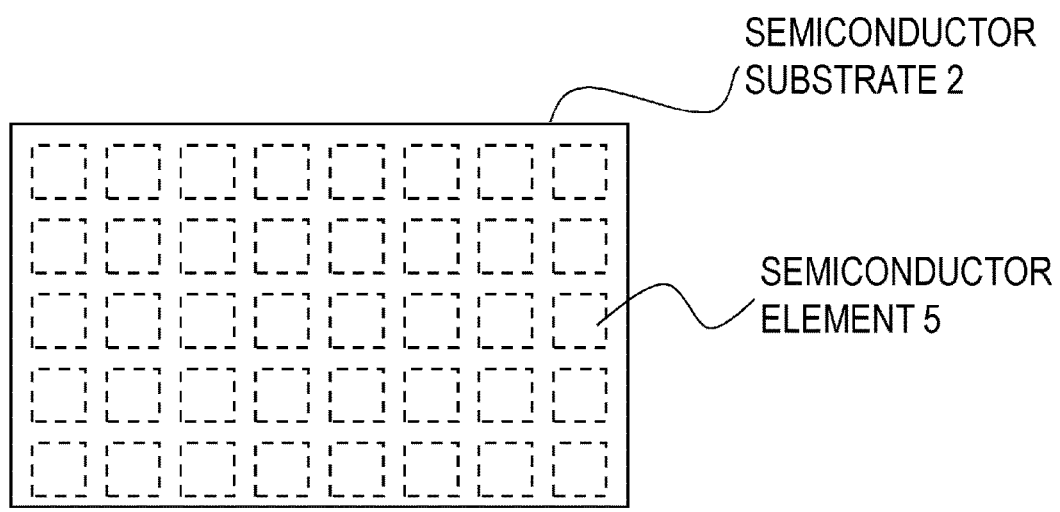
FIGS. 3A and 3B are diagrams illustrating an arrangement of a semiconductor element and a reverse surface element according to the second embodiment.
Figure 3B:
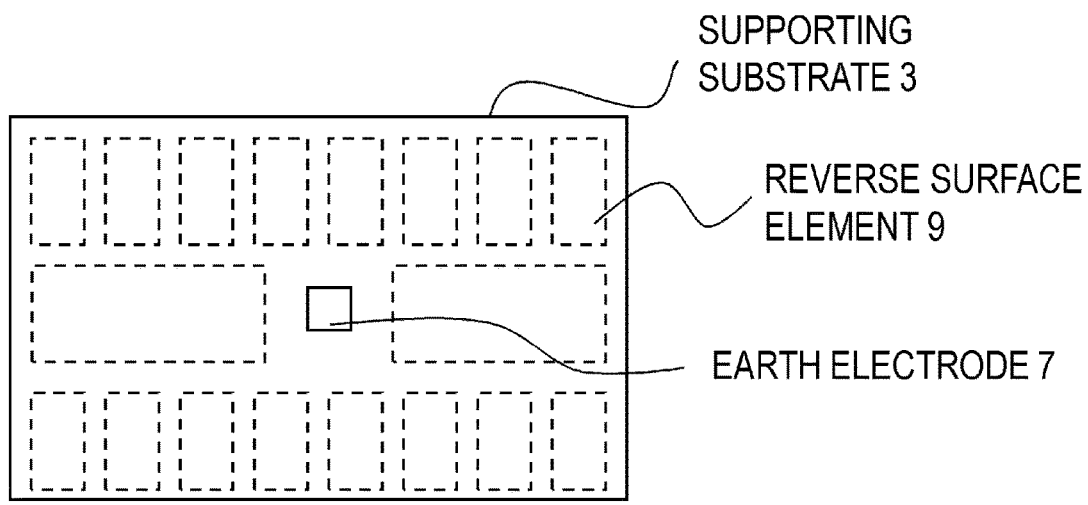

FIGS. 3A and 3B show an example of an arrangement of the semiconductor element 5 and the reverse surface element 9 with respect to a substrate. FIG. 3A shows how semiconductor elements 5 are arranged (formed) on a contact surface with the insulating film layer 4 in the semiconductor substrate 2. FIG. 3B shows how reverse surface elements 9 are arranged (formed) on a contact surface with the insulating film layer 4 in the supporting substrate 3. In this manner, the semiconductor elements 5 may be uniformly arranged with respect to the semiconductor substrate 2 and the reverse surface elements 9 may be evenly arranged with respect to the supporting substrate 3 with the exception of positions where the earth electrode 7 is present.

Effect

As described above, in the present embodiment, the reverse surface element 9 which constitutes a circuit is formed on the supporting substrate 3 which needs to be made thick in order to provide support. According to this configuration, downsizing of the solid-state element 1 can be realized as compared to a case where the circuit is formed on the semiconductor substrate 2 which needs to be formed as a thin film. Therefore, for example, this is particularly effective when using the solid-state element 1 with respect to an electron microscope because a volume of the solid-state element 1 is desirably small in order to maintain a super-high vacuum inside the electron microscope.

Third Embodiment

Figure 4:
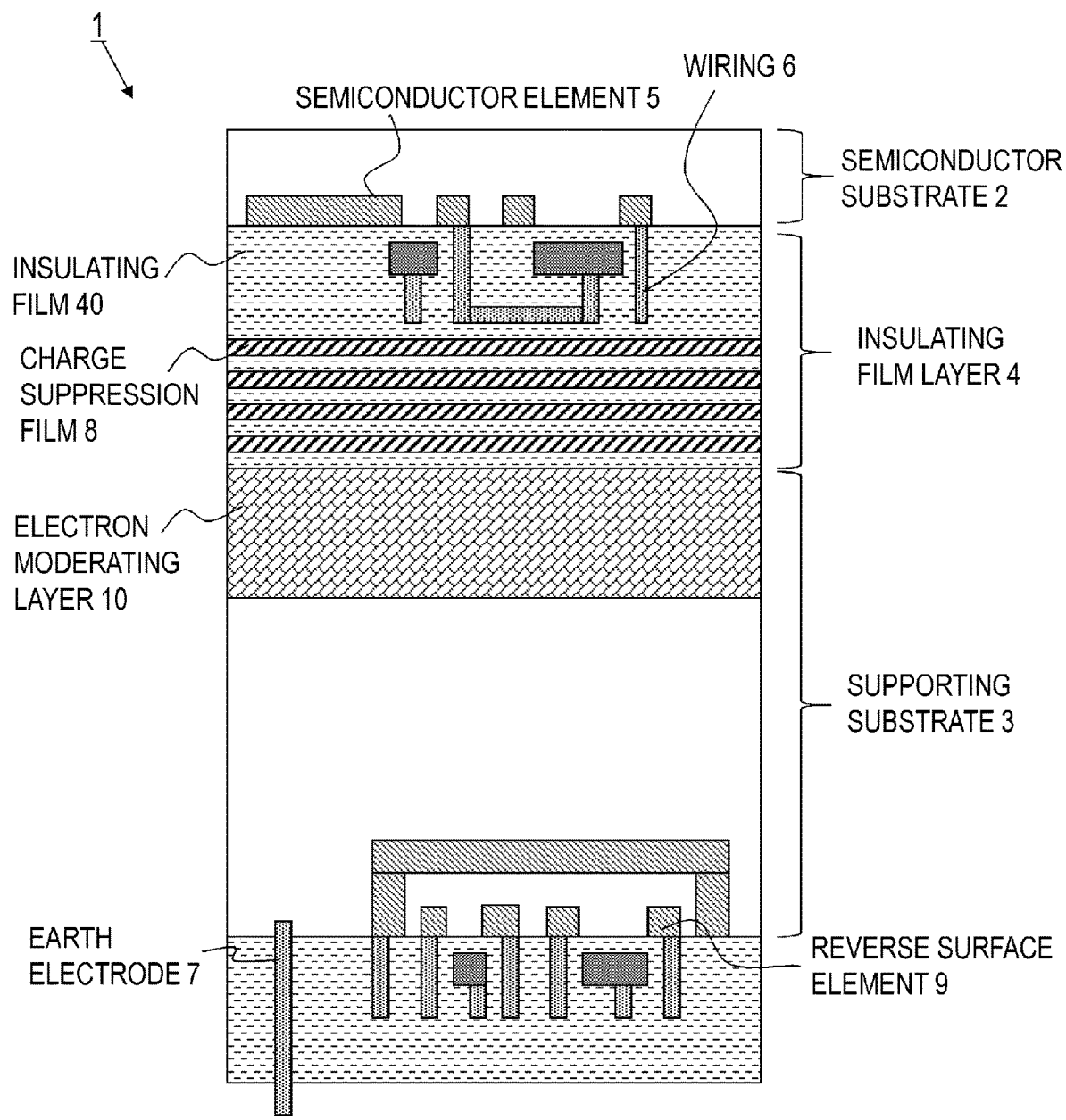
FIG. 4 is a configuration diagram of an example of a solid-state element according to a third embodiment.

The solid-state element 1 according to the present embodiment includes an electron moderating layer 10 in a part of the supporting substrate 3 in addition to the structure of the solid-state element 1 according to the second embodiment. In other words, the supporting substrate 3 according to the present embodiment is constituted by a semiconductor layer made of silicon and the electron moderating layer 10. FIG. 4 shows a configuration diagram of the solid-state element 1 according to the present embodiment.

In this case, the electron moderating layer 10 is formed on a side of the insulating film layer 4 in the supporting substrate 3 and prevents an electron beam from being incident to the reverse surface element 9 (a lower part of the supporting substrate 3). In the present embodiment, as the electron moderating layer 10, a layer of gold (Au) having a larger atomic weight (mass; density) than silicon (a semiconductor) is used. Due to the large atomic weight, an electron beam-stopping (absorbing) effect of gold is greater than that of silicon constituting the supporting substrate 3 in the second embodiment.

The penetration depth of a 300 keV electron beam with respect to gold is around 76 μm. When a thickness of the electron moderating layer 10 constituted by gold as described above is 76 μm, the supporting substrate 3 need only have enough of the layer constituted by silicon (the semiconductor layer) to form the reverse surface element 9 in addition to the electron moderating layer 10. In other words, the thickness of the electron moderating layer 10 is favorably greater than a penetration depth of an incident (detected) electron beam with respect to the material constituting the electron moderating layer 10. According to this configuration, since the thickness of the supporting substrate 3 can be reduced and the solid-state element 1 can be made thinner, the volume of the solid-state element 1 can be reduced. It should be noted that the electron moderating layer 10 is not limited to gold and the electron moderating layer 10 may also be constituted by other materials (elements, compounds, and mixtures) with a larger mass (density) than silicon. In other words, a penetration depth of an electron beam with respect to the material constituting the electron moderating layer 10 is favorably smaller than a penetration depth of the electron beam with respect to the material (silicon) constituting the semiconductor layer.

Furthermore, when the electron moderating layer 10 is a conductor, a similar effect to that of the charge suppression film 8 can be produced. In addition, the charge suppression film 8 can also produce a similar effect to the electron moderating layer 10 of suppressing penetration of an electron beam. The electron moderating layer 10 need not be formed in a part of the supporting substrate 3 and the electron moderating layer 10 may be formed in a part of the insulating film layer 4. In other words, the electron moderating layer 10 need only be formed between the semiconductor substrate 2 and the reverse surface element 9.

Effect

According to the configuration of the present embodiment, since the thickness of the supporting substrate 3 can be reduced, the volume of the solid-state element 1 can be further reduced.

Fourth Embodiment

Figure 5:
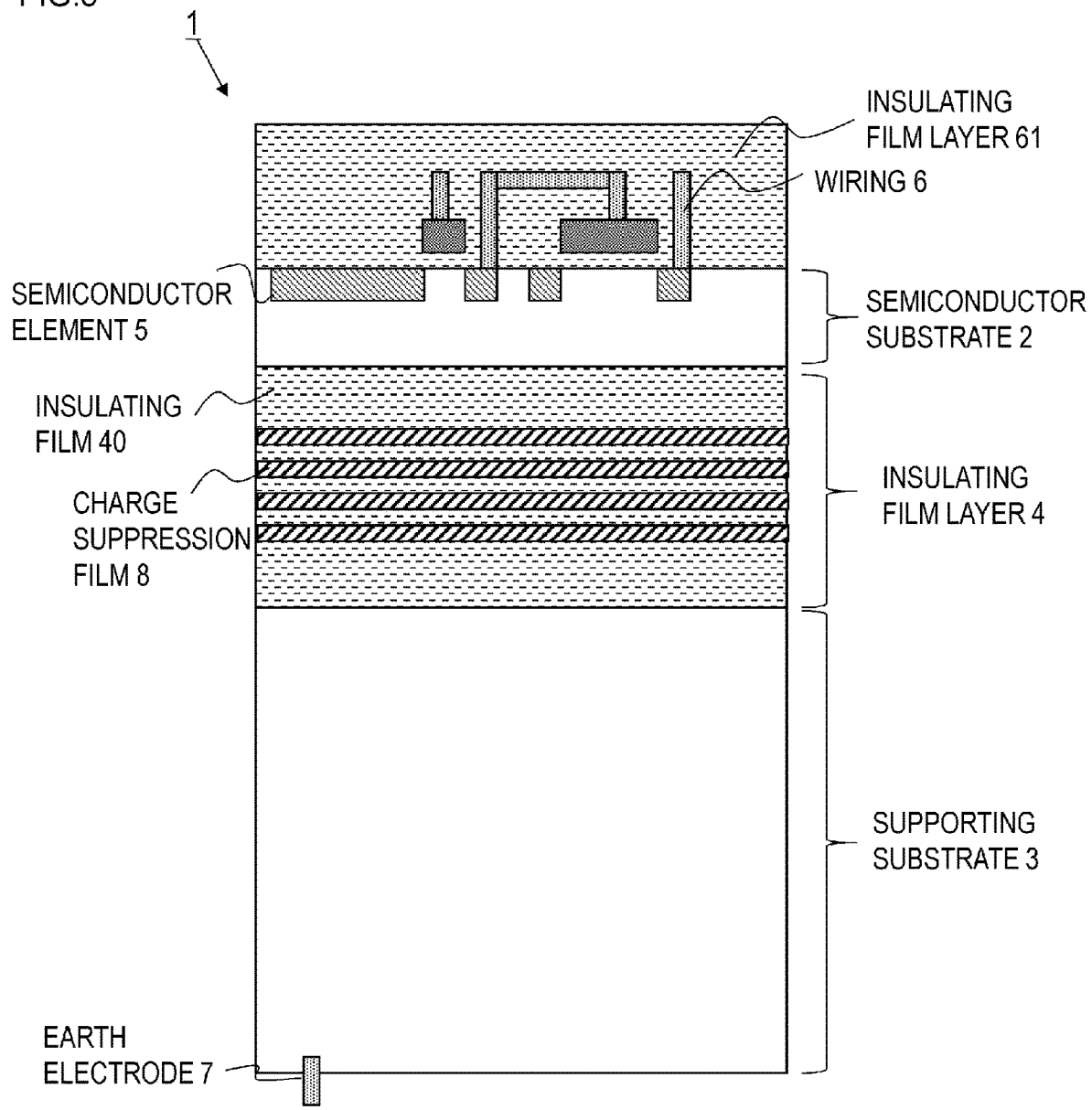
FIG. 5 is a configuration diagram of an example of a solid-state element according to a fourth embodiment.

FIG. 5 shows a configuration diagram of the solid-state element 1 according to the present embodiment. The solid-state element 1 according to the present embodiment differs from the solid-state element 1 according to the first embodiment in a position where the wiring 6 is formed. In the present embodiment, an insulating film layer 61 is formed so as to come into contact with a surface on an opposite side to a side in contact with the insulating film layer 4 in the semiconductor substrate 2. In addition, the wiring 6 is formed inside the insulating film layer 61.

Therefore, since there is no need to form the wiring 6 inside the insulating film layer 4, a general silicon-on-insulator (SOI) can be used. A general SOI substrate is constituted by three layers, namely, the semiconductor substrate 2 without the wiring 6, the insulating film layer 4 without the charge suppression film 8, and the supporting substrate 3. With respect to the SOI substrate, the charge suppression film 8 is formed inside the insulating film layer 4, the semiconductor element 5 is formed on the semiconductor substrate 2, and the earth electrode 7 is formed on the supporting substrate 3. In this case, since the semiconductor element 5 is to be connected to the wiring 6 in the insulating film layer 61 and the like, the semiconductor element 5 is formed in an upper part of the semiconductor substrate 2. In addition, the solid-state element 1 can be formed by forming the wiring 6 together with the insulating film layer 61 on an opposite side to a side in contact with the insulating film layer 4 in the semiconductor substrate 2.

Effect

As described above, according to the present embodiment, using a general SOI substrate eliminates the need to perform a bonding process of the semiconductor substrate 2 and the insulating film layer 4 and a bonding process of the insulating film layer 4 and the supporting substrate 3 which arise in the first embodiment and the like. Therefore, the solid-state element 1 according to the present embodiment produces a high yield while achieving cost reduction.

Fifth Embodiment

Figure 6:
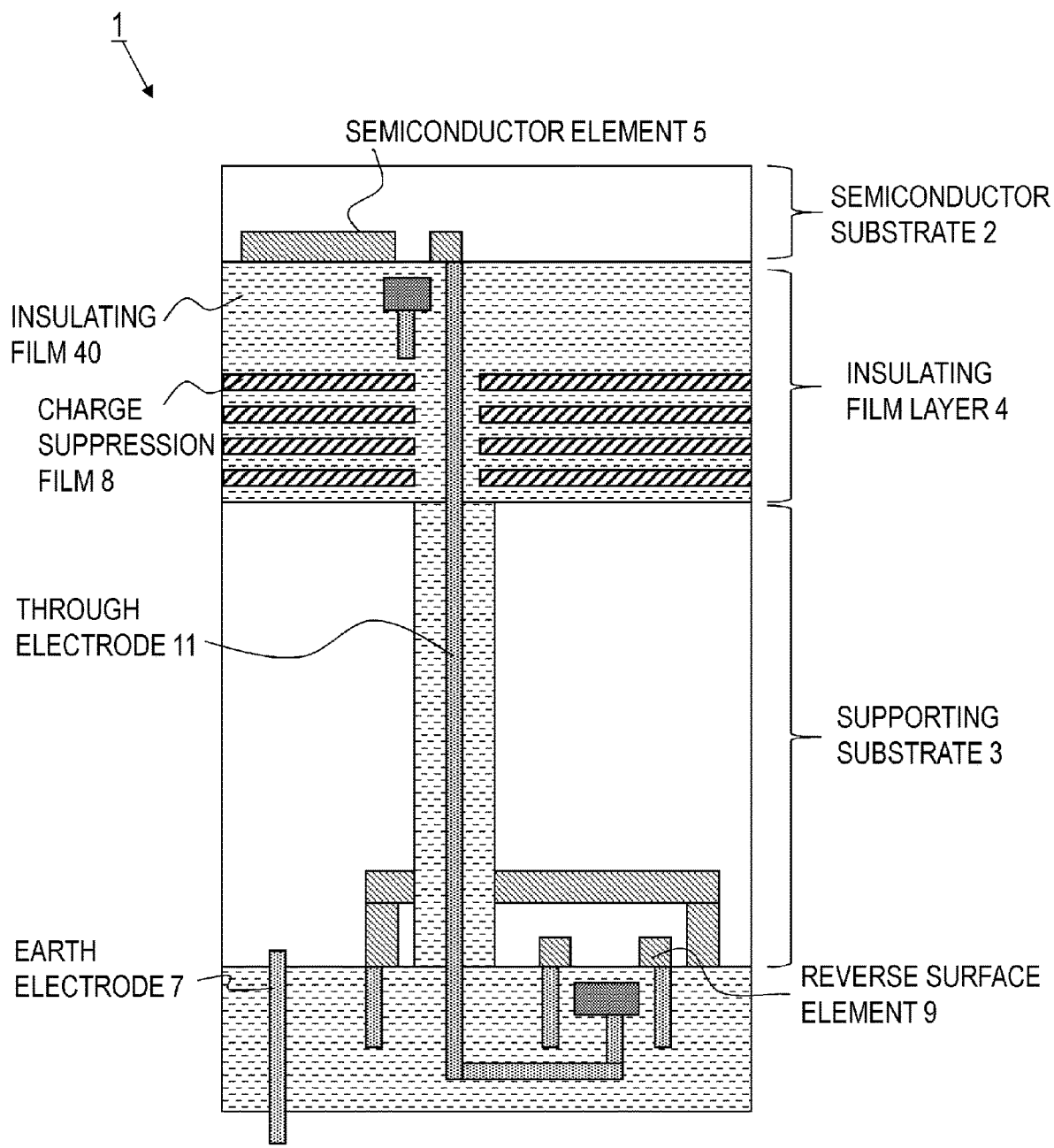
FIG. 6 is a configuration diagram of an example of a solid-state element according to a fifth embodiment.

In the solid-state element 1 according to the present embodiment, for each pixel (sensor) constituted by the semiconductor element 5, the semiconductor element 5 (the semiconductor substrate 2) and the reverse surface element 9 are connected to each other using a through electrode 11. FIG. 6 shows a configuration diagram of the solid-state element 1 according to the present embodiment.

The through electrode 11 is an electrode which penetrates the insulating film layer 4 and the supporting substrate 3 and which electrically connects the semiconductor element 5 (the semiconductor substrate 2) and the reverse surface element 9 to each other. In this case, the through electrode 11 is enclosed by an insulating film in order to prevent the through electrode 11 from being electrically connected to the charge suppression film 8 and the supporting substrate 3.

Effect

As described above, according to the present embodiment, a circuit operation performed by the semiconductor element 5 in the solid-state element 1 according to the first embodiment can be performed by the reverse surface element 9 in the present embodiment. Therefore, since a volume (area) of a portion for receiving light in the semiconductor element 5 can be increased, light receiving sensitivity of the solid-state element 1 improves.

Other Embodiments

The configurations and processes described in the various embodiments and variations of the present invention presented above can be used in any combination.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-236141, filed on Dec. 18, 2018, which is hereby incorporated by reference herein in its entirety.

What is claimed is:

1. A detector, comprising:
   a semiconductor substrate which detects an incident electron beam;
   a supporting substrate which is thicker than the semiconductor substrate and which supports the semiconductor substrate; and
   an insulating film layer which is provided between the semiconductor substrate and the supporting substrate, wherein
   at least one charge suppression film which is not electrically connected to the semiconductor substrate is formed inside the insulating film layer.

2. The detector according to claim 1, wherein the charge suppression film is a conductor.

3. The detector according to claim 1, wherein the charge suppression film is electrically connected to a power supply outside of the detector.

4. The detector according to claim 1, wherein
   the at least one charge suppression film includes a plurality of charge suppression films, and
   the plurality of charge suppression films are stacked via an insulating film in the insulating film layer.

5. The detector according to claim 1, wherein the semiconductor substrate has a part of a mechanism which converts an electron generated by an incidence of the electron beam into a signal.

6. The detector according to claim 1, wherein the supporting substrate has conductivity and is fixed to a constant potential via a grounding electrode.

7. The detector according to claim 1, wherein a reverse surface element which is a semiconductor element is formed on a surface not in contact with the insulating film layer of the supporting substrate.

8. The detector according to claim 7, wherein
   the supporting substrate has a semiconductor layer having the reverse surface element,
   the supporting substrate or the insulating film layer has an electron moderating layer, and
   a penetration depth of the electron beam with respect to a material constituting the electron moderating layer is smaller than a penetration depth of the electron beam with respect to a material constituting the semiconductor layer.

9. The detector according to claim 8, wherein a thickness of the electron moderating layer is greater than a penetration depth of the electron beam with respect to the material constituting the electron moderating layer.

10. The detector according to claim 7, wherein the semiconductor substrate and the reverse surface element are electrically connected to each other via a through electrode which penetrates the insulating film layer and the supporting substrate.

11. The detector according to claim 1, further comprising a wiring layer which is electrically connected to the semiconductor substrate, wherein
   the wiring layer is not formed inside the insulating film layer but formed inside a second insulating film layer in contact with a surface not in contact with the insulating film layer of the semiconductor substrate.

* * * * *